US 9,484,412 B1

(12) United States Patent
Ando et al.

(10) Patent No.: US 9,484,412 B1
(45) Date of Patent: Nov. 1, 2016

(54) STRAINED SILICON—GERMANIUM INTEGRATED CIRCUIT WITH INVERSION CAPACITANCE ENHANCEMENT AND METHOD TO FABRICATE SAME

(71) Applicant: International Business Machines Corporation, Armonk, NY (US)

(72) Inventors: Takashi Ando, Tuckahoe, NY (US); Pouya Hashemi, White Plains, NY (US); Pranita Kerber, Mount Kisco, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/862,345

(22) Filed: Sep. 23, 2015

(51) Int. Cl.
*H01L 27/092* (2006.01)
*H01L 29/10* (2006.01)
*H01L 29/66* (2006.01)
*H01L 29/78* (2006.01)
*H01L 21/28* (2006.01)
*H01L 29/423* (2006.01)
*H01L 27/12* (2006.01)

(52) U.S. Cl.
CPC ..... *H01L 29/1054* (2013.01); *H01L 21/28158* (2013.01); *H01L 27/1211* (2013.01); *H01L 29/42364* (2013.01); *H01L 29/66795* (2013.01); *H01L 29/785* (2013.01); *H01L 29/7849* (2013.01)

(58) Field of Classification Search
CPC ............. H01L 27/0924; H01L 29/1054
See application file for complete search history.

(56) References Cited

U.S. PATENT DOCUMENTS

| 7,524,740 | B1 | 4/2009 | Liu et al. |
| 7,968,438 | B2 | 6/2011 | Han et al. |
| 8,900,973 | B2 | 12/2014 | Berliner et al. |
| 8,901,537 | B2 | 12/2014 | Murthy et al. |
| 2008/0146008 | A1 | 6/2008 | Han et al. |
| 2013/0052801 | A1* | 2/2013 | Berliner ............ H01L 21/845 438/468 |
| 2014/0167114 | A1 | 6/2014 | Derluyn et al. |
| 2014/0374797 | A1* | 12/2014 | Kwon ............ H01L 29/1054 257/190 |
| 2015/0060945 | A1 | 3/2015 | Murthy et al. |
| 2016/0104799 | A1* | 4/2016 | Qi ............ H01L 29/7849 257/29 |

* cited by examiner

*Primary Examiner* — Daniel Shook
(74) *Attorney, Agent, or Firm* — Harrington & Smith; Louis J. Percello

(57) ABSTRACT

A structure includes a substrate; a plurality of pFET fins disposed over the substrate; and a plurality of nFET fins disposed over the substrate. In the structure each of the plurality of pFET fins is composed of s-$Si_{1-x}Ge_x$, where x has a value in a range of about 0.4-0.6; each of the plurality of nFET fins is composed of one of s-Si or a Group III-V material; and each of the plurality of pFET fins and the plurality of nFET fins includes a thin (e.g., <1 nm) multilayer structure containing a plurality s-Ge monolayers disposed on a surface thereof, a gate dielectric disposed over the multilayer structure, and a gate conductor disposed over the gate dielectric. The presence of the multilayer structure containing the plurality s-Ge monolayers enhances $T_{inv}$ scaling by effectively increasing a Ge percentage of the s-$Si_{1-x}Ge_x$ pFETs. Methods to fabricate the structure are also disclosed.

20 Claims, 5 Drawing Sheets

STRAINED SILICON—GERMANIUM INTEGRATED CIRCUIT WITH INVERSION CAPACITANCE ENHANCEMENT AND METHOD TO FABRICATE SAME

TECHNICAL FIELD

The various embodiments of this invention relate generally to semiconductor devices and fabrication techniques and, more specifically, relate to the fabrication of fin field effect transistor (FinFET) devices using strained $Si_{1-x}Ge_x$ semiconductor material.

BACKGROUND

Strained $Si_{1-x}Ge_x$ with a mid-level Ge content of approximately 0.5 is a viable candidate for small geometry devices (e.g., 7 nm) and beyond. The Ge level is sufficient, as far as leakage considerations are concerned, for fabricating high-performance devices. In addition, the charge carrier mobility is theoretically adequate with a reasonable strain, which can be achieved by growing the $Si_{1-x}Ge_x$ material on a strain relaxed buffer (SRB) or on strained Si direct on insulator (SSDOI).

In this environment the equivalent inversion capacitance oxide thickness ($CET_{inv}$ or $T_{inv}$) becomes an important consideration for achieving an aggressive gate length that is needed with tightly contacted gate pitches.

SUMMARY

In a first aspect thereof the embodiments of this invention provide a method that comprises providing a substrate that supports a layer of strained SiGe (s-SiGe) and a layer of strained Si (s-Si); defining first fins in the layer of s-SiGe and second fins in the layer of s-Si; and depositing a layer of Ge on the first fins and on the second fins, where the layer of Ge is comprised of at least one monolayer and has a total thickness equal to or less than about one nanometer. The method further includes forming a gate dielectric on the layer of Ge and depositing first gate metal over the gate dielectric on the first fins and second gate metal over the gate dielectric on the second fins.

In another aspect thereof the embodiments of this invention provide a structure that comprises a substrate; a plurality of pFET fins disposed over the substrate; and a plurality of nFET fins disposed over the substrate. In the structure each of the plurality of pFET fins is comprised of $s-Si_{1-x}Ge_x$ where x has a value in a range of about 0.4-0.6; each of the plurality of nFET fins is comprised of one of s-Si or a Group III-V material; and each of the plurality of pFET fins and the plurality of nFET fins comprises a multilayer structure comprised of a plurality s-Ge monolayers disposed on a surface thereof, a gate dielectric disposed over the multilayer structure, and a gate conductor disposed over the gate dielectric.

BRIEF DESCRIPTION OF THE SEVERAL VIEWS OF THE DRAWINGS

The drawing Figures are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically:

FIG. 1A depicts an embodiment having a strain relaxed buffer (SRB) on which a strained Si (s-Si) layer is disposed, while FIG. 1B depicts a semiconductor on insulator (SOI) embodiment having an oxide layer on which the s-Si layer is disposed;

DETAILED DESCRIPTION

Figure 1A:
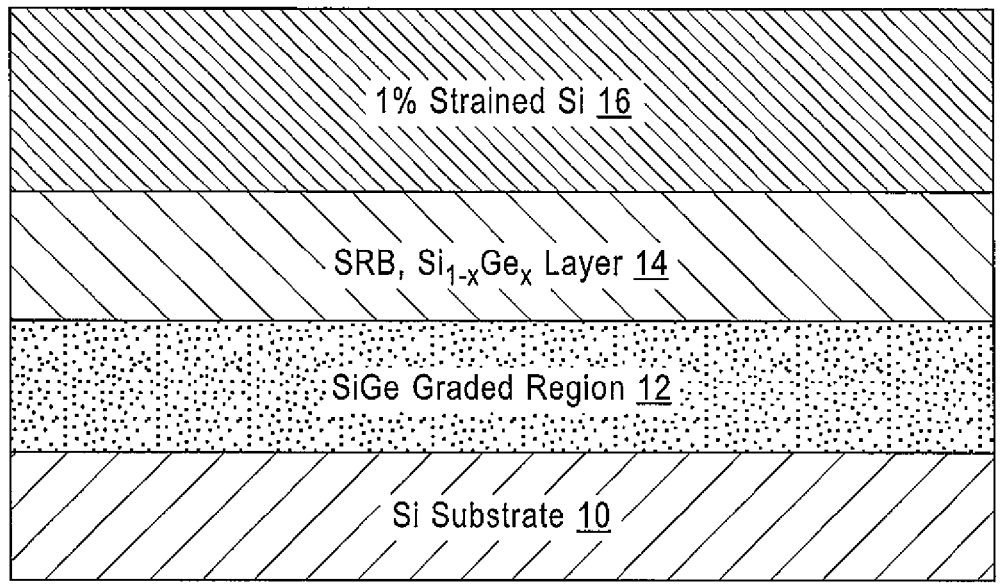
FIGS. 1A and 1B, collectively referred to FIG. 1, each show a starting structure (starting wafer) where

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LPCVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In some embodiments this invention can employ semiconductor on insulator (SOI) technology where a thin semiconductor layer, such as a layer of SiGe or a layer of Si, is formed over an insulating layer, such as silicon oxide, which in turn is formed over a substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

Strain engineering using strained Si (s-Si) for n-type FETs (nFETs) and strained silicon-germanium (s-$Si_{1-x}Ge_x$) for p-type FETs (pFETs) is a viable option for fabricating small geometry bulk finFETs for high-performance applications. One suitable candidate is s-Si on a 25% strain relaxed buffer (SRB), which exhibits about 1% tensile strain for nFETs, and about 50% s-$Si_{1-x}Ge_x$, x=0.50, on a 25% SRB that results in about 1% compressive strain for pFETs.

As was noted above, the $CET_{inv}$ or $T_{inv}$ is an important consideration for achieving aggressive gate lengths that are needed with tightly contacted gate pitches. However, the interface passivation for a desired level of Ge (e.g., x ~0.5) in $Si_{1-x}Ge_x$ is difficult to obtain, and resulting typical $T_{inv}$ levels can be ~12 A-13 A. An aspect of this invention increases the Ge content to improve the $T_{inv}$ scaling.

In accordance with an exemplary embodiment of this invention there is provided a structure having s-$Si_{1-x}Ge_x$ (with x having a value in an exemplary range of about 0.4-0.6) FinFETs on a SRB for pFETs and an ultra-thin strained-Ge (e.g., a few mono-layers) capping layer (total thickness equal to or less than about 1 nm). In that no barrier (but a quantum well) is formed, the $T_{inv}$ is not affected. Moreover, the Ge surface facilitates the $T_{inv}$ scaling and enables it to be scaled down to, for example, 0.8 nm-0.9 nm using a high dielectric constant (hi-k), e.g., $AlO_x/HfO_2$, gate stack.

The embodiments of this invention can be used in combination with s-Si or Group III-V material for nFETs, where for the s-Si material a conduction band offset is not incurred.

FIG. 1A shows one non-limiting embodiment of a starting structure (starting wafer) that includes Si substrate 10 of arbitrary thickness (e.g., a <100> Si substrate) having an overlying graded $Si_{1-x}Ge_x$ layer or region 12 and a SRB 14 formed of a layer of $Si_{1-x}Ge_x$ (x=0.25 in this example). In this embodiment, during the epitaxial growth of the $Si_{1-x}Ge_x$ graded layer or region 12 the value of x is gradually or step-wise increased in the vertical direction during epitaxial growth from about zero to a value desired in the SRB 14, or in this non-limiting embodiment about 0.25. Precursors for the epitaxial growth process, e.g., a CVD process, can include silicon-derived silane and dichlorosilane, and germanium-derived germane, germanium tetrachloride and isobutylgermane. The SRB 14 can have an exemplary thickness in a range of 30 nm to about 35 nm. Overlying the SRB 14 is an s-Si layer 16 having an exemplary thickness in a range of 20 nm to about 50 nm. In this embodiment the s-Si layer 16 can exhibit about 1% strain.

Figure 1B:
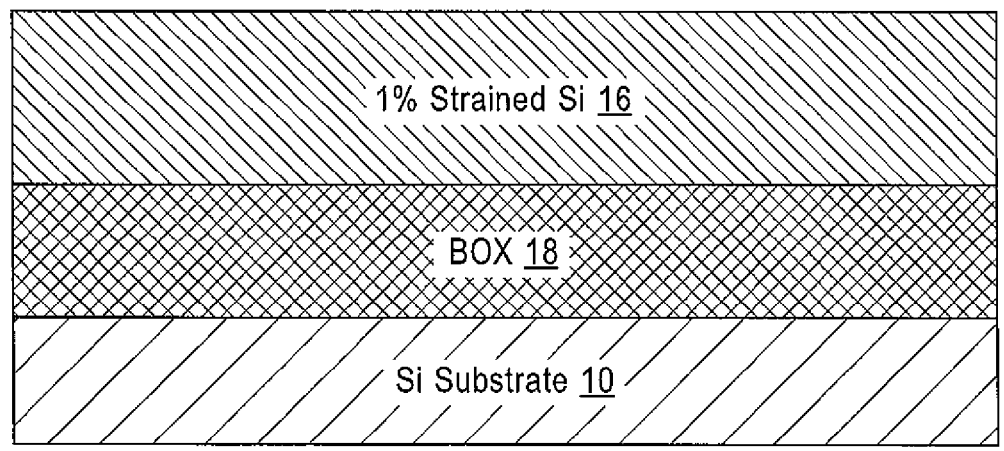

FIG. 1B shows another non-limiting embodiment (an equivalent SSDOI embodiment) of a starting structure that includes the Si substrate 10 and a BOX layer 18. The BOX layer 18 can have an exemplary thickness in a range of 30 nm to about 35 nm. Overlying the BOX layer 18 is the s-Si layer 16 having the exemplary thickness in a range of 20 nm to about 50 nm. In this embodiment the s-Si layer 16 can exhibit about 1% strain.

Biaxial tensile strained Si directly on insulator (SSDOI) is a layer of silicon, typically disposed directly on a dielectric layer formed on a semiconductor substrate, in which the silicon atoms are stretched beyond their normal interatomic distance. An increased distance between stretched or strained atoms reduces the atomic forces that interfere with the movement of electrons through transistors formed in the SSDOI, i.e., increased electron mobility. Strained SSDOI substrates can be formed by a combination of CVD and layer transfer processes. The strained SSDOI substrates include a Si-containing layer with any crystal orientation; where <100> is a typical crystal orientation and biaxial tensile strain. Biaxial tensile strain is a term used to describe a net stress caused by longitudinal and lateral tensile stresses induced in a Si layer at or during the SSDOI substrate formation.

The ensuing description will focus primarily on the SRB embodiment shown in FIG. 1A, although it should be kept in mind that the SSDOI embodiment of FIG. 1B could be used as well.

Figure 2:
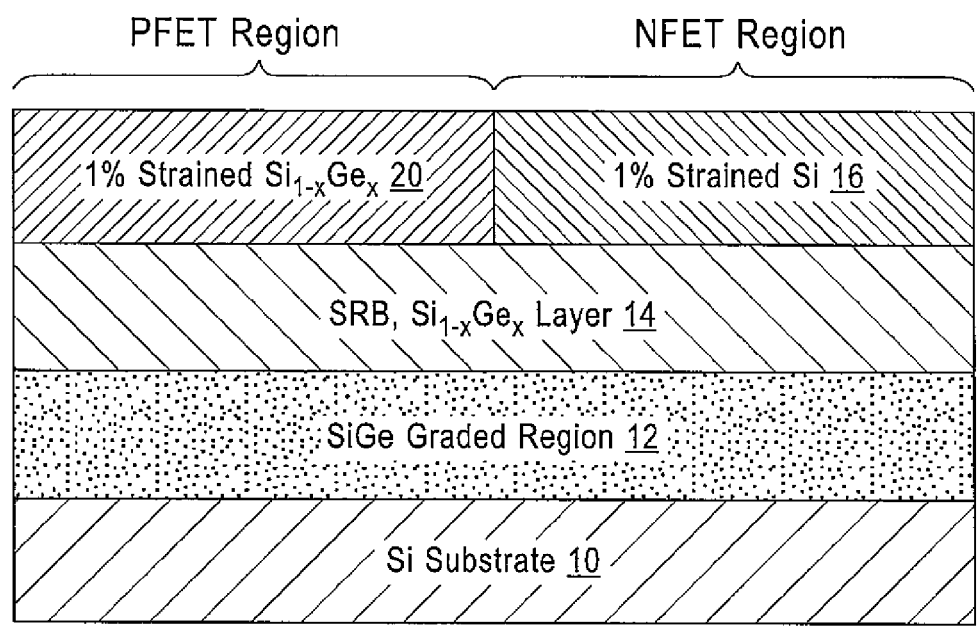
FIG. 2 shows the structure of FIG. 1A after removing a portion of the s-Si in what will be a pFET region, leaving a remaining portion of the s-Si layer in what will be an nFET region, and growth of a strained $Si_{1-x}Ge_x$ (s-SiGe) layer on the surface of the SRB where the s-Si layer was removed.

FIG. 2 shows the structure of FIG. 1A after removing a portion of the s-Si layer 16 in what will be a pFET region, thereby leaving a remaining portion of the s-Si layer 16 in what will be an nFET region. The s-Si layer 16 can be removed using an etchant (e.g. KOH) that is selective to the SRB layer 14. Next a layer 20 of, for example, 1% strained $Si_{1-x}Ge_x$ (s-SiGe) is epitaxially grown on the surface of the SRB 14 where the s-Si layer 16 was removed in the pFET region. In the layer 20 the value of x can be in an exemplary range of about 0.4 to about 0.6, with 0.5 being one suitable nominal value.

In some embodiments the s-Si layer 16 could be removed and replaced with a layer of another type of semiconductor material, such as one having desired high electron mobility (e.g., a Group III-V semiconductor material such as GaAs or AlGaAs).

Figure 3:
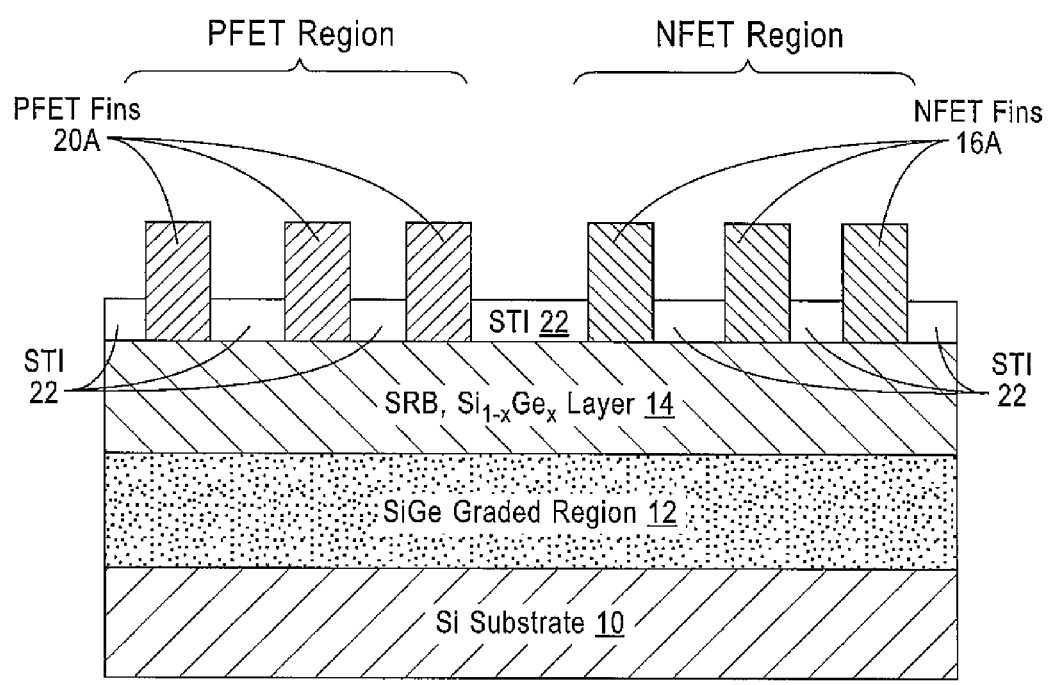
FIG. 3 shows the structure of FIG. 2 after defining pFET fins in the layer of s-SiGe and nFET fins in the layer of s-Si.

FIG. 3 shows the structure of FIG. 2 after performing masking and etching procedures to define pFET fins 20A in the layer 20 of strained $Si_{1-x}Ge_x$ and nFET fins 16A in the layer of, for example, s-Si 16. In a non-limiting example the fins 16A and 20A can have a width in a range of about 3 nm to about 20 nm, with 7 nm-8 nm being a suitable nominal width, and a height in a range of about 20 nm to about 50 nm, with 35 nm being one suitable non-limiting height. The fin length (into the drawing page) can be any suitable value. The six fins shown in FIG. 3 are for illustrative purposes only since, in practice, some thousands or millions of fins can be defined, each forming a part of a subsequently fabricated FET device.

FIG. 3 also shows the deposition of a dielectric layer isolation layer 22 (referred to for convenience as a shallow trench isolation (STI) layer) on the surface of the SRB 14 to a thickness that surrounds just bottom portions of the defined fins 16A and 20A. That portion of the fins 16A and 20A that extends above the STI layer 22 can be considered as defining an active portion of the fins. Trenches can be formed in the STI layer 22 to electrically and physically isolate the fins 16A and 20A from one another. The STI layer 22 can be, for example, an oxide layer such as $SiO_2$. For the SSDOI embodiment of FIG. 1B, that includes the dielectric layer embodied as the BOX 18, the STI layer 22 may be omitted.

Figure 4:
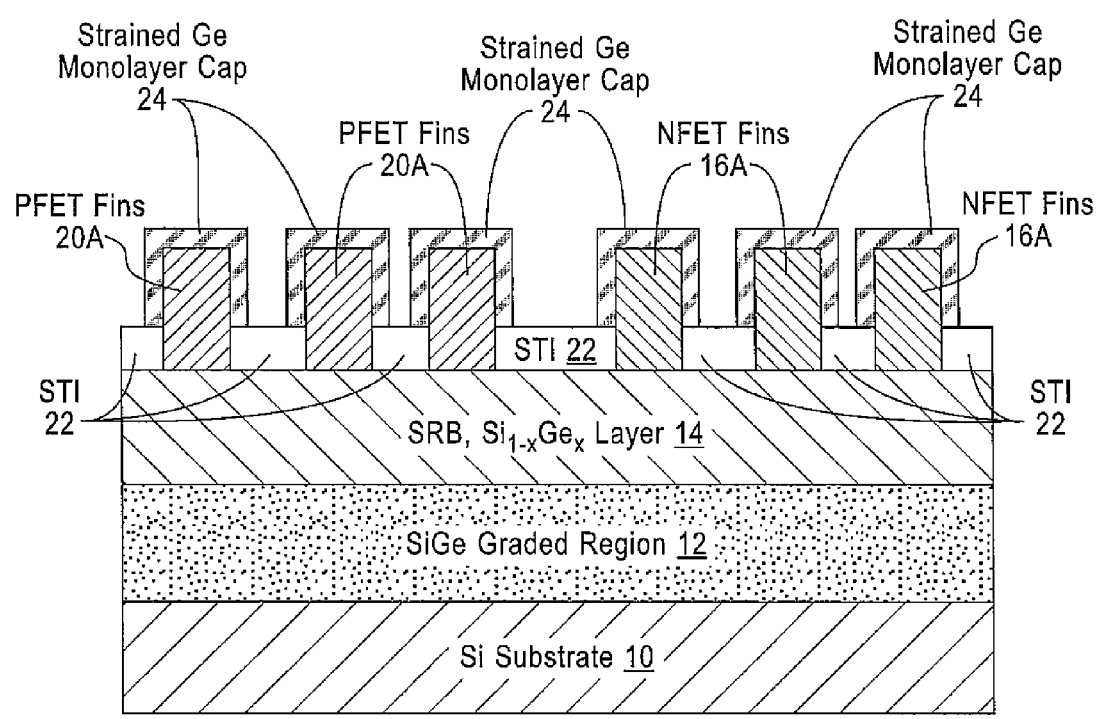
FIG. 4 shows the structure of FIG. 3 after epitaxially forming, in accordance with an aspect of this invention, a multi-monolayer strained Ge (s-Ge) cap layer over the pFET fins and the nFET fins.

FIG. 4 shows the structure of FIG. 3 after epitaxially forming, in accordance with an aspect of this invention, a multi-monolayer strained Ge (s-Ge) cap layer 24 over the fins 16A and 20A. The multi-layer s-Ge cap layer 24 can have, for example, a total thickness of less than about 1 nm. The s-Ge cap layer 24 is deposited selective to the isolation layer 22 using an epitaxy process with a Ge source such as. The epitaxy process can be one of rapid-thermal epitaxy (RTE), atomic layer epitaxy (ALE), or UHVCVD. As a non-limiting example, if the s-Ge cap layer 24 has a thickness of about 1 nm then about 9-10 s-Ge monolayers may be grown on the underlying 1% strained $Si_{1-x}Ge_x$ (s-SiGe) material of the pFET fins 20A and the 1% strained Si material of the nFET fins 16A. More or less than 10 s-Ge monolayers may be grown. For example, in some embodiments a single s-Ge monolayer may be provided. In some embodiments there can be one or more monolayers of s-Si included in the cap layer 24. Preferably, the cap layer 24 will have a total Ge concentration in a range of about 70% to 100%.

Figure 5A:
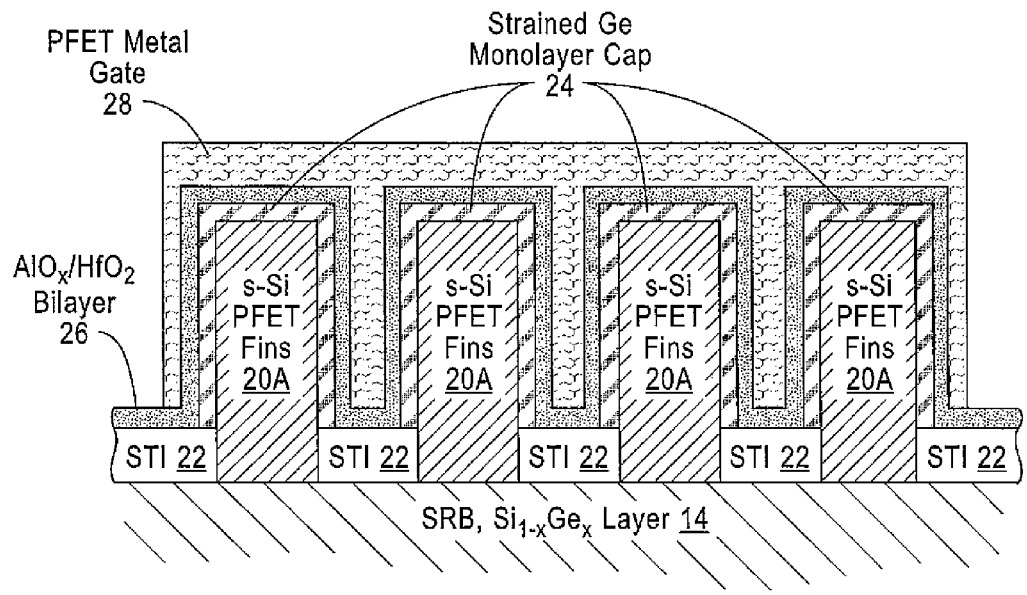
FIGS. 5A and 5B, collectively referred to as FIG. 5, each shows a portion of the structure of FIG. 4 that includes the s-SiGe pFET fins (FIG. 5A) and the s-Si nFET fins (FIG. 5B) after deposition of a gate dielectric (e.g., an $AlOx/HfO_2$ bilayer) on the s-Ge cap layer and deposition of gate metal.
Figure 5B:
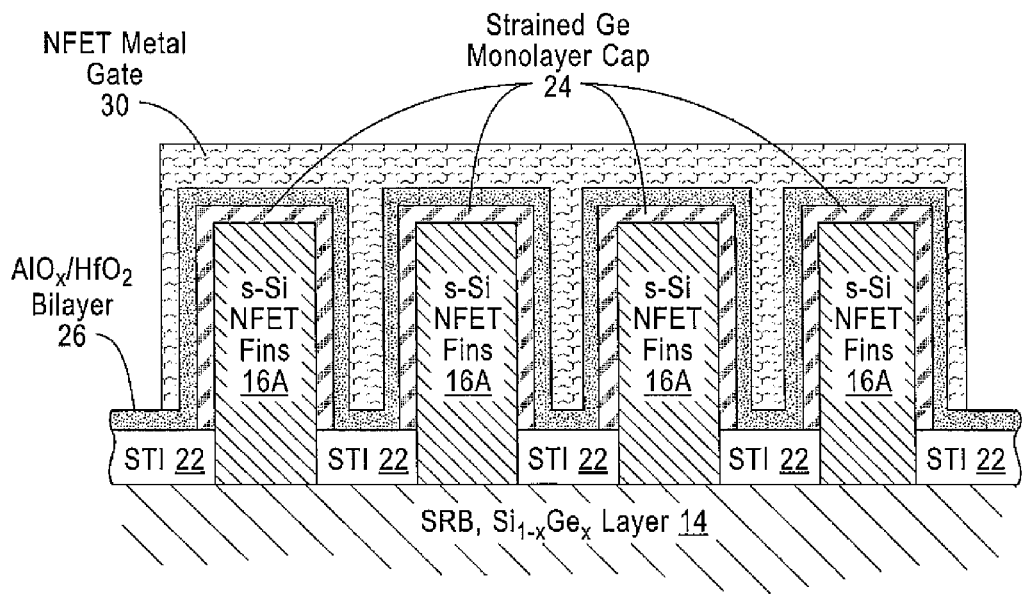

FIGS. 5A and 5B each show a portion of the structure of FIG. 4 after depositing a gate dielectric on the s-Ge cap layer 24 followed by deposition of gate conductor material. In a non-limiting embodiment the gate dielectric can be comprised of a bilayer structure having a high dielectric constant (hi-k) metal oxide layer that is disposed on the s-Ge cap layer 24, and an overlying layer of dielectric material. In one embodiment the hi-k layer can be a thin layer of $HfO_2$ (dielectric constant of ~25), and the overlying layer of dielectric material can be a layer of $AlO_x$ (e.g., $Al_2O_3$, dielectric constant of ~9). An anneal using $NH_3$ can be performed after depositing the bilayer structure.

FIG. 5A shows a portion of the structure that includes the s-SiGe pFET fins 20A (four fins being shown in this non-limiting embodiment) disposed on the SRB 14. FIG. 5B shows a portion of the structure that includes the s-Si nFET fins 16A (again, four fins being shown in this non-limiting embodiment) that are disposed on the SRB 14. As can be seen in FIG. 5A, disposed on the pFET fins 20A and the overlying s-Ge cap layer 24 and the $AlO_x/HfO_2$ bilayer 26 is a pFET work function (WF) metal gate (MG) 28. FIG. 5B shows a corresponding nFET WF MG 30 disposed on the nFET fins 16A and the overlying s-Ge cap layer 24 and the $AlO_x/HfO_2$ bilayer 26. In this non-limiting example the MGs 28 and 30 merge the four fins. In other embodiments more or less than four fins could be associated with the MGs.

In general, a dielectric metal oxide can have a dielectric constant that is greater than the dielectric constant of silicon nitride (7.5). The high-k dielectric layer (e.g., the layer of $HfO_2$) may be formed by methods well known in the art including, for example, chemical vapor deposition (CVD), atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials, in addition to $HfO_2$, include $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiOXN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer may be from about 1 nm to about 10 nm, and more preferably from about 1.5 nm to about 3 nm. The high-k dielectric layer can have an effective oxide thickness (EOT) on the order of, or less than, about 1 nm.

In the illustrated embodiments the $AlO_x$ layer can have a thickness in a range of about 0.3 nm to about 0.7 nm. In other embodiments of this invention a dielectric other than $AlO_x$ can be used such as, for example, $LaO_x$, $ScO_x$, $YO_x$ or $MgO_x$.

The gate metal 28, 30 can be deposited directly on the $AlO_x/HfO_2$ bilayer 26 by, for example, CVD or ALD. As non-limiting examples the gate metal can include a metal system selected from one or more of TiN, TiC, TiAlC, TaN, TaC, TaAlC, TaSiN, HfN, W, Al and Ru, and may be selected at least in part based on the desired work function (WF) of the device (nFET or pFET), as is known.

Processing can then continue in a conventional manner to define source/drains (S/Ds), provide dielectric layers, form S/D and gate metal contacts and form vertical and horizontal metallization to interconnect the nFETs and pFETs into a desired circuit topology.

As should be appreciated, the embodiments of this invention enable enhanced $T_{inv}$ scaling by effectively increasing the Ge percentage of the SiGe pFET fins by the presence of the s-GE cap layer 24.

It is to be understood that the exemplary embodiments discussed above with reference to FIGS. 1-5 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those semiconductor materials, metals, insulators, layer thicknesses, epitaxial deposition processes and the like that were specifically disclosed above. Any and all such and similar modifications of the teachings of this invention will still fall within the scope of this invention.

What is claimed is:

1. A method comprising:
   providing a substrate supporting a layer of strained SiGe (s-SiGe) and a layer of strained Si (s-Si);
   defining first fins in the layer of s-SiGe and second fins in the layer of s-Si;
   depositing a layer of Ge on the first fins and on the second fins, where the layer of Ge is comprised of at least one monolayer and has a total thickness equal to or less than about one nanometer;
   forming a gate dielectric on the layer of Ge; and
   depositing first gate metal over the gate dielectric on the first fins and second gate metal over the gate dielectric on the second fins.

2. The method as in claim 1, where the first fins are comprised of s-$Si_{1-x}Ge_x$ where x has a value in a range of about 0.4-0.6.

3. The method as in claim 1, where the s-SiGe exhibits about a 1% strain, and where the s-Si exhibits about a 1% strain.

4. The method as in claim 1, where the substrate is comprised of a Si substrate having a SiGe strain relaxed buffer disposed over a surface.

5. The method as in claim 4, where the SiGe strain relaxed buffer is a layer of $Si_{1-x}Ge_x$ where x has a value of about 0.25.

6. The method as in claim 4, where the substrate further comprises a graded SiGe layer interposed between a top surface of the Si substrate and the strain relaxed buffer.

7. The method as in claim 1, where the substrate is comprised of a strained Si direct on insulator (SSDOI) substrate, where the layer of s-SiGe and the layer of s-Si are disposed on a surface of the insulator.

8. The method as in claim 1, where providing the substrate provides a layer of s-SiGe, and where the method further comprises removing a portion of the layer of s-SiGe where pFETs are to be formed, and depositing the layer of s-SiGe where the portion of the layer of s-SiGe is removed.

9. The method as in claim 1, where the step of defining the first fins in the layer of s-SiGe and the second fins in the layer of s-Si further comprises depositing a dielectric layer to surround bottom portions of the defined fins.

10. The method as in claim 1, where the gate dielectric is a bilayer formed by depositing a layer of a high dielectric constant material on the layer of Ge, and depositing a layer of dielectric material on the layer of the high dielectric constant material.

11. The method as in claim 10, where the high dielectric constant material is comprised of $HfO_2$ and where the layer of dielectric material is comprised of $AlO_x$.

12. The method of claim 11, where forming the gate dielectric further comprises performing a $NH_3$ anneal.

13. The method as in claim 1, where depositing the layer of Ge on the first fins and on the second fins deposits one or more monolayers of strained Ge (s-Ge).

14. A structure comprising:
    a substrate;
    a plurality of pFET fins disposed over the substrate; and
    a plurality of nFET fins disposed over the substrate; where each of the plurality of pFET fins is comprised of s-$Si_{1-x}Ge_x$ where x has a value in a range of about 0.4-0.6;
    each of the plurality of nFET fins is comprised of one of s-Si or a Group III-V material;
    and where each of the plurality of pFET fins and the plurality of nFET fins comprises a multilayer structure comprised of a plurality s-Ge monolayers disposed on a surface thereof, a gate dielectric disposed over the multilayer structure, and a gate conductor disposed over the gate dielectric.

15. The structure as in claim 14, where the multilayer structure has a total thickness equal to or less than about one nanometer.

16. The structure as in claim 14, where the pFET fins are comprised of s-$Si_{1-x}Ge_x$ where x has a value in a range of about 0.4-0.6 and exhibits about a 1% strain.

17. The structure as in claim 14, where the substrate is comprised of one of a strained Si direct on insulator (SSDOI) substrate or a Si substrate having a SiGe strain relaxed buffer disposed over a surface, where the SiGe strain relaxed buffer comprises a layer of $Si_{1-x}Ge_x$ where x has a value of about 0.25.

18. The structure as in claim 14, where the gate dielectric is a bilayer comprised of a layer of a high dielectric constant material disposed on the multilayer structure and a layer of dielectric material disposed on the layer of the high dielectric constant material.

19. The structure as in claim 18, where the high dielectric constant material is comprised of $HfO_2$ and where the layer of dielectric material is comprised of $Al_2O_3$.

20. The structure as in claim 14, where the multilayer structure comprised of the plurality s-Ge monolayers enhances $T_{inv}$ scaling by effectively increasing a Ge percentage of a s-$Si_{1-x}Ge_x$ pFET.

* * * * *